United States Patent [19]

Pauly

[11] Patent Number: 5,270,653
[45] Date of Patent: Dec. 14, 1993

[54] SELECTIVE THREE DIMENSIONAL EXCITATION FOR MAGNETIC RESONANCE APPLICATIONS

[75] Inventor: John M. Pauly, Menlo Park, Calif.

[73] Assignee: The Board of Trustees of the Leland Stanford Junior University, Stanford, Calif.

[21] Appl. No.: 866,732

[22] Filed: Apr. 10, 1992

[51] Int. Cl.$^5$ .............................. G01R 33/20
[52] U.S. Cl. .................................... 324/309
[58] Field of Search ............... 324/300, 307, 309, 310, 324/311, 312, 313, 314, 318, 322; 128/653.2, 653.5

[56] References Cited

U.S. PATENT DOCUMENTS

| | | | |
|---|---|---|---|
| 4,748,410 | 5/1988 | Macovski | 324/309 |
| 5,105,152 | 4/1992 | Pauly | 324/309 |
| 5,122,747 | 6/1992 | Riederer et al. | 324/309 |

Primary Examiner—Michael J. Tokar
Attorney, Agent, or Firm—Townsend and Townsend Khourie and Crew

[57] ABSTRACT

A method of selectively exciting nuclear spins in a limited three-dimensional volume comprising the steps of applying a plurality of subpulses in the presence of three orthogonal magnetic gradients ($G_x$, $G_y$, $G_z$) over a period of time to define a k-space trajectory including a plurality of stacked two-dimensional k-space spirals arranged in pairs with each pair having an outward spiral and an inward spiral, the steps of one spiral to the next spiral corresponding to gradient pulses ($G_z$) alternately at the edge and at the origin of each k-space spiral plane. The selective three-dimensional excitation pulse can be used with a non-selective 90° pulse to the volume prior to applying the plurality of RF subpulses and allowing nuclear spins in the volume to precess, then applying the plurality of RF subpulses to selectively refocus nuclear spins in the volume, and detecting and echo signal. The selective three-dimensional excitation pulse can be used also to tag nuclear spins of moving fluid such as blood in the volume and detecting echo signals from the tagged nuclear spins in a selective inversion recovery angiography method for coronary artery imaging.

13 Claims, 9 Drawing Sheets

NON-INTERLEAVED, PEAK SIDELOBE 15%

INTERLEAVED, PEAK SIDELOBE 5%

$|M_y|$ $10 \times |M_x|$ $|M_y|$ $10 \times |M_x|$

SELECTIVE THREE DIMENSIONAL EXCITATION FOR MAGNETIC RESONANCE APPLICATIONS

The U.S. Government has rights in the disclosed invention pursuant to National Institute of Health grants HL-39478, HL-39297, HV-38045, HL-34962, NCI-CA50948, and NCI-CA48269.

BACKGROUND OF THE INVENTION

This invention relates generally to magnetic resonance systems, and more particularly the invention relates to selective three dimensional excitation in magnetic resonance applications.

In magnetic resonance applications such as imaging and spectroscopy, a strong static magnetic field is employed to line up atoms whose nuclei have an odd number of protons and/or neutrons, that is, have spin angular momentum and a magnetic dipole moment. A second RF magnetic field, applied as a single pulse transverse to the first, is then used to pump energy into these nuclei, flipping them over, for example to 90° or 180°. After excitation the nuclei gradually return to alignment with the static field and give up the energy in the form of weak but detectable free induction decay (FID). These FID signals are used by a computer to produce images.

The excitation frequency, and the FID frequency, is defined by the Larmor relationship which states that the angular frequency, $\omega_o$, of the precession of the nuclei is the product of the magnetic field, $B_o$, and the so-called gyromagnetic ratio, $\gamma$, a fundamental physical constant for each nuclear species:

$$\omega_o = B_o \cdot \gamma$$

Accordingly, by superimposing a linear gradient field, $B_z = z \cdot G_z$, on the static uniform field, $B_o$, which defines the Z axis, for example, nuclei in a selected X-Y plane can be excited by proper choice of the frequency spectrum of the transverse excitation field applied along the X or Y axis. Similarly, a gradient field can be applied in the X-Y plane during detection of the FID signals to spatially localize the FID signals in the plane. The angle of nuclear spin flip in response to an RF pulse excitation is proportional to the integral of the pulse over time.

Heretofore, selective RF and gradient waveforms have been used in spin echo imaging of two dimensional slices and in blood flow imaging by "tagging" or spin inverting of nuclear spins of blood flowing into a slice of non-inverted static material and then detecting the FID of the blood. In theory, multidimensional pulses should be designable to be selective in any number of dimensions. In practice, available gradient power has enforced a limit of two dimensions on excitations pulses.

The present invention is directed to three dimensional excitation pulses which are feasible on commercial imaging machines and to the magnetic resonance apparatus and methods utilizing the selective three-dimensional excitation pulses.

SUMMARY OF THE INVENTION

Accordingly, an object of the invention is magnetic resonance apparatus for selective three-dimensional excitation of nuclear spins.

Another object of the invention is a method of selectively exciting a limited volume for the tagging of a moving fluid such as blood.

Still another object of the invention is a method of selectively refocusing precessing nuclear spins in a limited volume for spin echo magnetic resonance imaging.

Briefly, a method of selectively exciting nuclear spins in a limited three-dimensional volume in accordance with the invention includes the steps of applying a plurality of RF subpulses in the presence of three orthogonal magnetic gradients ($G_x$, $G_y$, $G_z$) over a period of time to define a k-space trajectory including a plurality of stacked two-dimensional k-spaced spirals arranged in pairs with each pair having outward spiral and an inward spiral. The steps from one spiral to the next spiral correspond to gradient pulses ($G_z$) alternately at the edge and the origin of each k-spaced spiral plane.

Each RF subpulse is designed using the method in accordance with co-pending application Ser. No. 07/497,226 filed Mar. 22, 1990 for *"Magnetic Resonance Imaging and Spectroscopy Using A Linear Class of Large Tip-Angle Selective Excitation Pulses"*. As described therein an inherently refocused small tip-angle excitation pulse is defined which produces a rotation about an axis. Then a sequence of the small-tip angle excitation pulses is produced and concatenated whereby the sum of the tip-angle is produced by the sequence of pulses results in desired net large tip angle. The small tip-angle pulses have a Hermitian RF weighted k-space trajectory. The tip-angle is the Fourier transform of the weighted k-space trajectory.

In one application, a non-selective 90° pulse can be applied to a volume prior to applying the plurality of RF subpulses thereby allowing nuclear spins in a volume to precess, then the plurality of RF subpulses is applied to selectively refocus nuclear spins in the volume and then detecting a spin-echo signal.

In another application, the plurality of RF subpulses tags nuclear spins of a moving fluid in the volume, and signals of the tagged nuclear spins is then detected to image blood vessels as in selective inversion recovery angiography.

The invention and objects and features thereof will be more readily apparent from the following detailed description and appended claims when taken with the drawings.

DETAILED DESCRIPTION OF THE ILLUSTRATIVE EMBODIMENTS

Figure 1A:
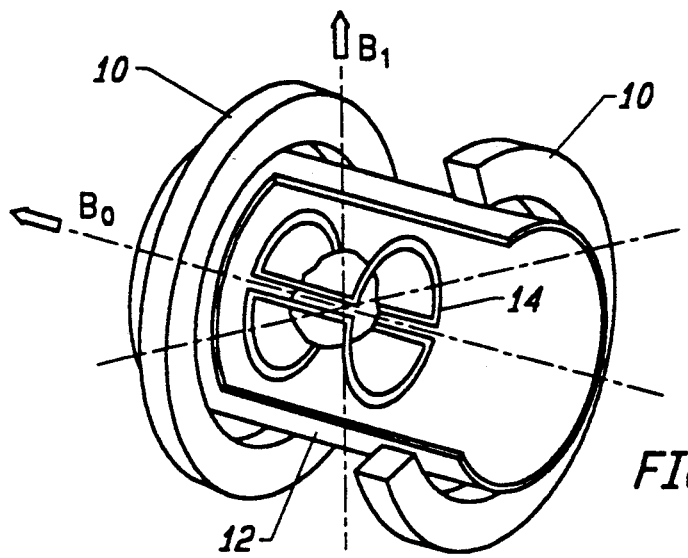
FIGS. 1A-1D illustrate the arrangement of conventional MRI apparatus and magnetic fields generated therein.
Figures 1B, 1C, 1D:
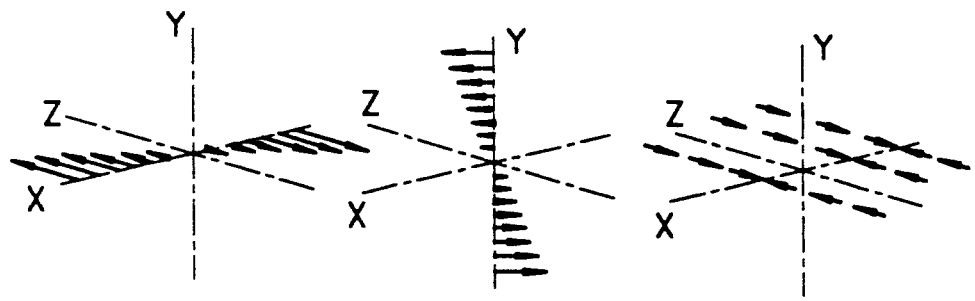

Referring now to the drawing, FIG. 1A is a perspective view partially in section illustrating coil apparatus in an NMR imaging system, and FIGS. 1B-1D illustrate field gradients which can be produced in the apparatus of FIG. 1A. This apparatus is discussed by Hinshaw and Lent, "An Introduction to NMR Imaging: From the Bloch Equation to the Imaging Equation," Proceedings of the IEEE, Vol. 71, No. 3, March 1983, pp. 338-350. Briefly, the uniform static field $B_o$ is generated by the magnet comprising the coil pair 10. A gradient field $G_x$ is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_o$ and varies linearly with distance along the X axis but does not vary with distance along the Y or Z axes. FIGS. 1C and 1D are similar representations of the Y gradient and Z gradient fields, respectively.

Figure 2:
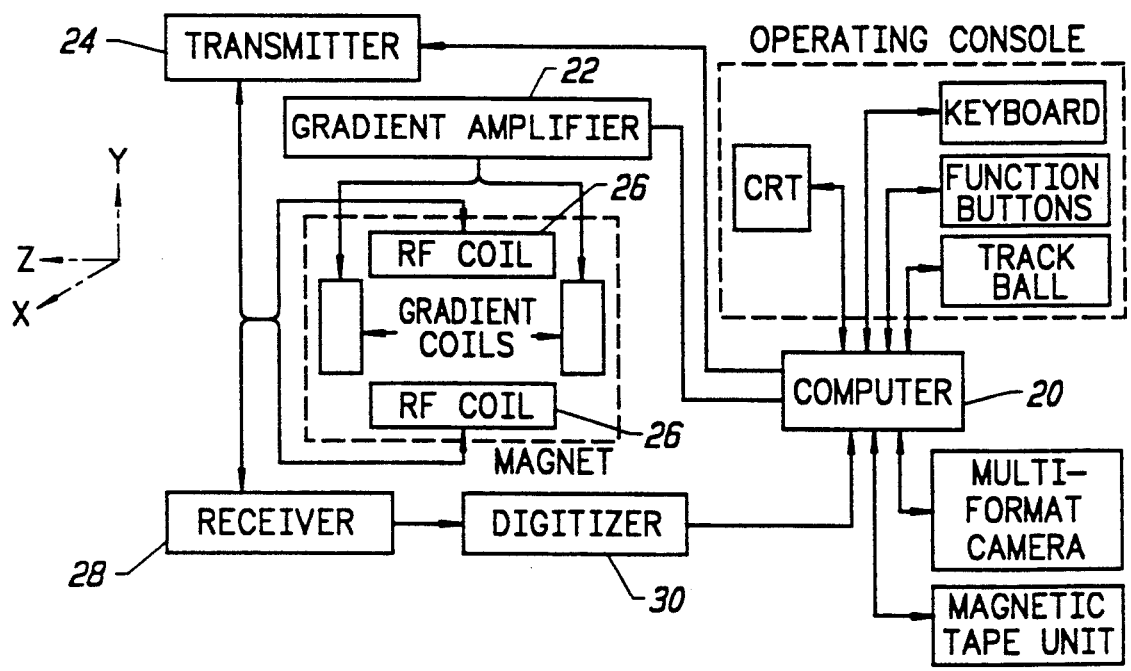
FIG. 2 is a functional block diagram of magnetic resonance imaging apparatus.

FIG. 2 is a functional block diagram of the imaging apparatus as disclosed in *NMR - A Perspective on Imaging*, General Electric Company, 1982. A computer 20 is programmed to control the operation of the NMR apparatus and process FID signals detected therefrom. The gradient field is energized by a gradient amplifier 22, and the RF coils for impressing an RF magnetic moment at the Larmor frequency is controlled by the transmitter 24 and the RF coils 26. After the selected nuclear have been flipped, the RF coils 26 are employed to detect the FID signal which is passed to the receiver 28 and thence through digitizer 30 for processing by computer 20.

In accordance with the present invention, a selective three-dimensional excitation pulse is provided which is feasible on commercial imaging machines. In illustrative applications, the pulse can be used for tagging a moving fluid such as blood for the imaging of vessels as in selective inversion recovery angiography in imaging coronary arteries In another application the pulse can be used for the refocusing of spins in a pulse echo imaging application.

Figure 3A:
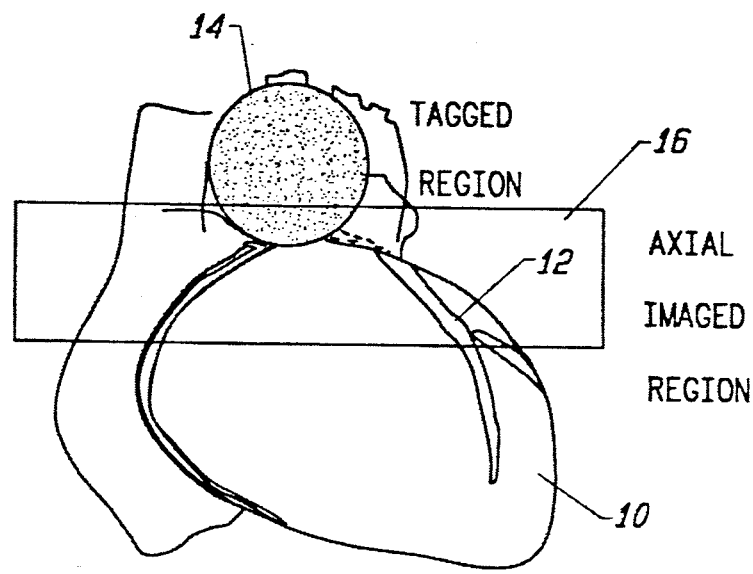
FIGS. 3A, 3B illustrate the imaging geometry for the selective inversion recovery (SIR) angiography method for coronary artery imaging and an image required using the method in accordance with one embodiment of the invention.
Figure 3B:

The imaging geometry for selective inversion recovery angiography of the coronary arteries is illustrated in FIG. 3A which shows the heart 10, coronary artery 12, and aorta 14. The axial imaged region is 16. An initial selective three-dimensional inversion pulse in accordance with the invention tags the blood in the root of the aorta 14, which is the coronary blood supply. Other large blood pools are not tagged because signals produced therein could obscure the image. A pulse in accordance with the invention is ideal as a tagging pulse in limiting the inversion of spins to blood at the root of the aorta. Since only blood is of concern the pulse need only perform well over the frequency range due to inhomogeneity, which is about 1-2 ppm. An actual image made using the technique with a three-dimensional tag pulse in accordance with the invention is shown in FIG. 3B. The imaged vessel seen is the left anterior descending coronary artery.

In designing the selective three-dimensional excitation pulse, a k-space trajectory is used that is a combination of linear and echo-planar types of pulses. Echo-planar pulses consist of a sequence of subpulses each selective along one axis, modulated by an envelope that is selective along another axis. Each of the subpulses is a two dimensional spiral pulse. The combination of the two-dimensional spiral pulse with a selective envelope provides three-dimensional selectivity in a single pulse.

Two major issues are present in designing multidimensional pulses. First, the coverage of k-space can only be continuous in at most one dimension. In other dimensions the coverage is discrete and this produces side lobes in addition to the desired main lobe. The nature and location of these side lobes can be a major concern. The second issue is the effect of off-resonance frequency on the selected volume. Off resonance results from the chemical shifts of the different species, from the inhomogeneity of the main magnetic field, and from field shifts due to the spatially varying magnetic susceptibility of the subject Off resonance has different effects on different types of k trajectories. Pulses based on spiral k-trajectories tend to blur. Pulses based on echo-planar type trajectories tend to shift in the slow gradient direction.

The coronary tagging application has several features that make it particularly suitable for the application of a three-dimensional inversion pulse. First, there is considerable latitude in placing the side lobes. Second, inversion pulse side lobes are substantially less than those for an excitation pulse. Finally, only blood is of concern. Therefore, the range of off-resonance frequencies is that due to inhomogeneity and susceptibility induced shifts, about 1-2 ppm. This is far less than the 3.4 ppm lipid shift.

The initial step in designing a three-dimensional pulse is the selection of a k-space trajectory. In the following illustrative embodiment, we use a trajectory having a sequence of 8 disks in the $k_x-k_y$ dimensions which are separated by uniform steps in $k_z$. The disks are covered by three turn constant slew rate spirals. Each outward-inward spiral pair is rotated by 90° from the previous pair in order to reduce the peak side lobe levels. The steps from one disk to the next disk are provided by blips in the z gradient, alternately at the edge and at the origin of the $k_x-k_y$ plane. The trajectory is plotted in FIG. 4.

The RF is designed in two stages. First each subpulse (for each disk) is designed using the linear method disclosed in co-pending application Ser. No. 07/497,226 supra. A Gaussian k-space weighting is chosen as in the co-pending application. This sequence of subpulses is then weighted by an 8 point hard pulse sequence which is designed by taking an 8 point Hanning window function and computing its inverse Shinnar-Le Roux transform. See Pauly, et al. "Parameter Relaxations for the Shinnar-Le Roux Selective Excitation Pulse Design Algorithm" IEEE Transactions on Medical Imaging, Volume 10, No. 1, March 1991 pages 53-65. The result is a hard pulse sequence with a spin echo profile that is the square of the frequency spectrum of the Hanning window.

The design of each subpulse in accordance with the method of the co-pending application is based on the k-space interpretation of small tip angle excitation disclosed by Pauly, et al. "A k-space Analysis of Small-Tip-Angle Excitation", Journal of Magnetic Resonance 81, 43–56 (1989). Pauly, et al. introduced a k-space interpretation of small-tip-angle selective excitation. They showed that multi-dimensional selective excitation in the presence of time-varying gradients can be analyzed using Fourier transform theory. Using this interpretation, they designed and implemented selective excitation pulses that are selective in two spatial dimensions. Based on a small-tip-angle approximation, selective excitation is interpreted as a weighted trajectory through k-space. The slice profile is the Fourier transform of this weighted trajectory. The new excitation pulse may also be viewed as the consequence of the symmetries of the Bloch equation.

As described in the co-pending application, it has been determined that these pulses continue to work well at large tip angles. This investigation leads to a general class of selective excitation pulses that may be designed based on a k-space analysis, and are valid at any tip angle.

Figure 4:
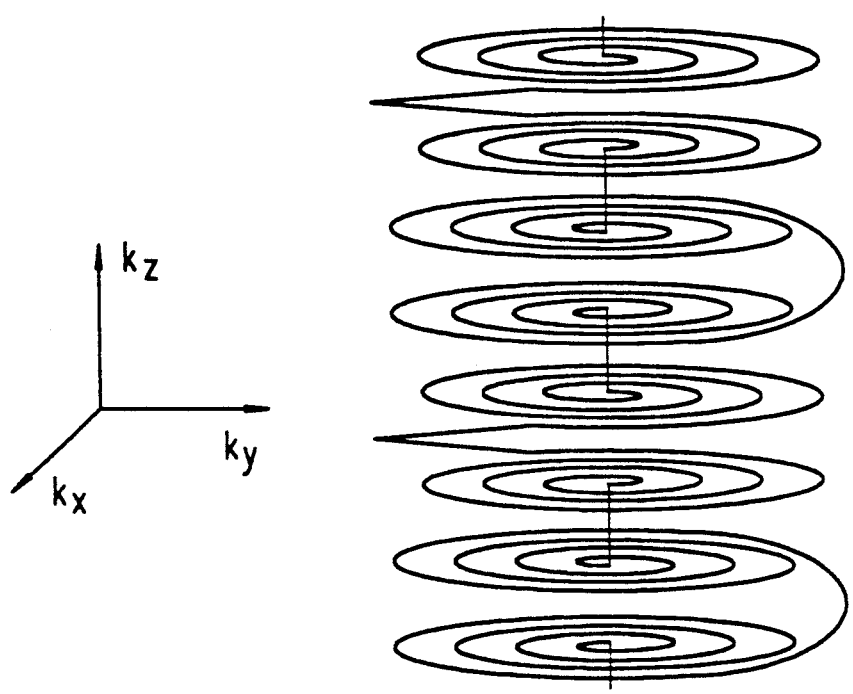
FIG. 4 illustrates a three-dimensional k-space trajectory for a selective three-dimensional pulse in accordance with the invention.
Figure 5:
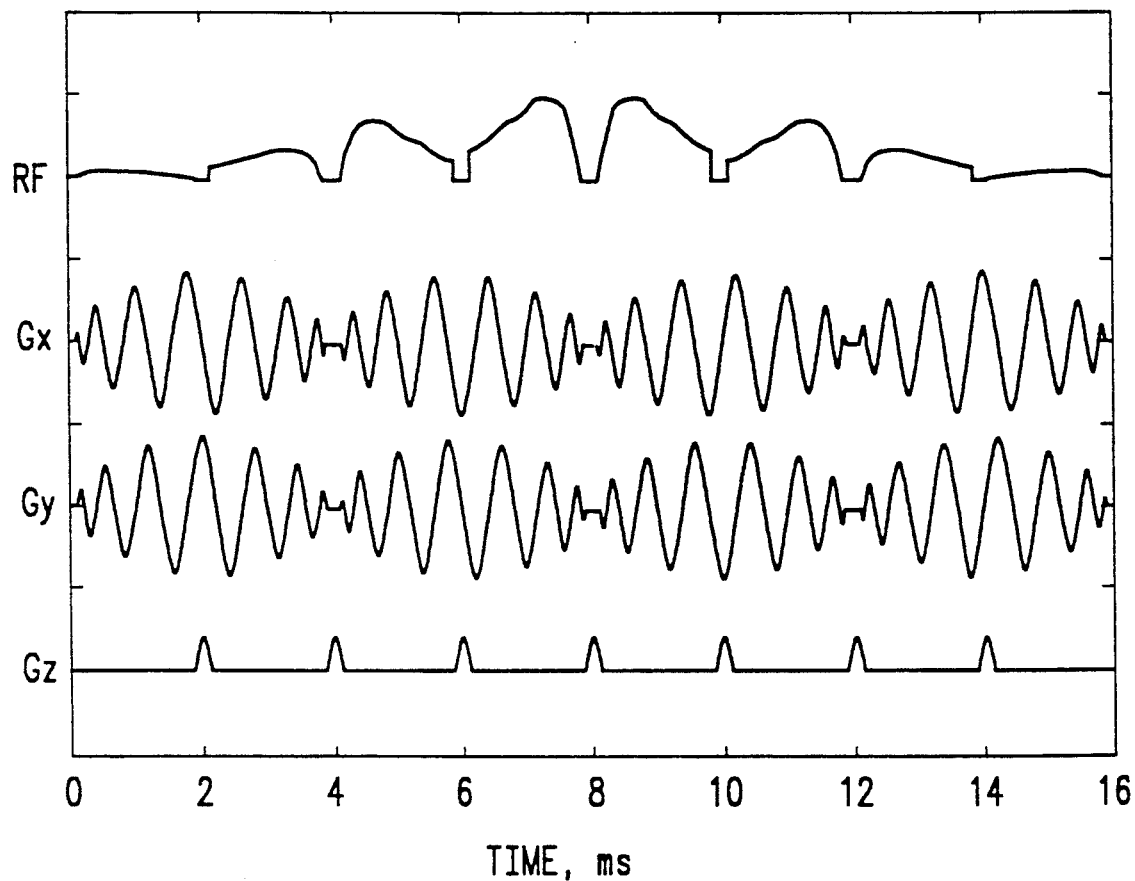
FIG. 5 illustrates the RF and gradient waveforms to cover the k-spaced trajectory of FIG. 4.
Figure 6A:
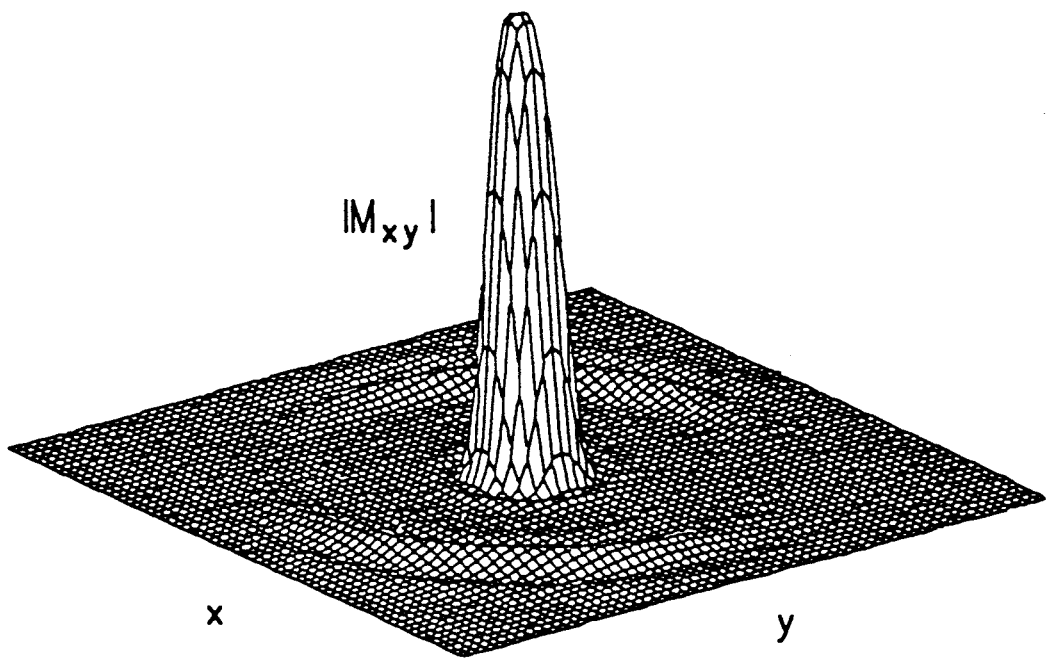
FIGS. 6A, 6B are simulated spin echo profiles for the pulse of FIG. 5.
Figure 6B:
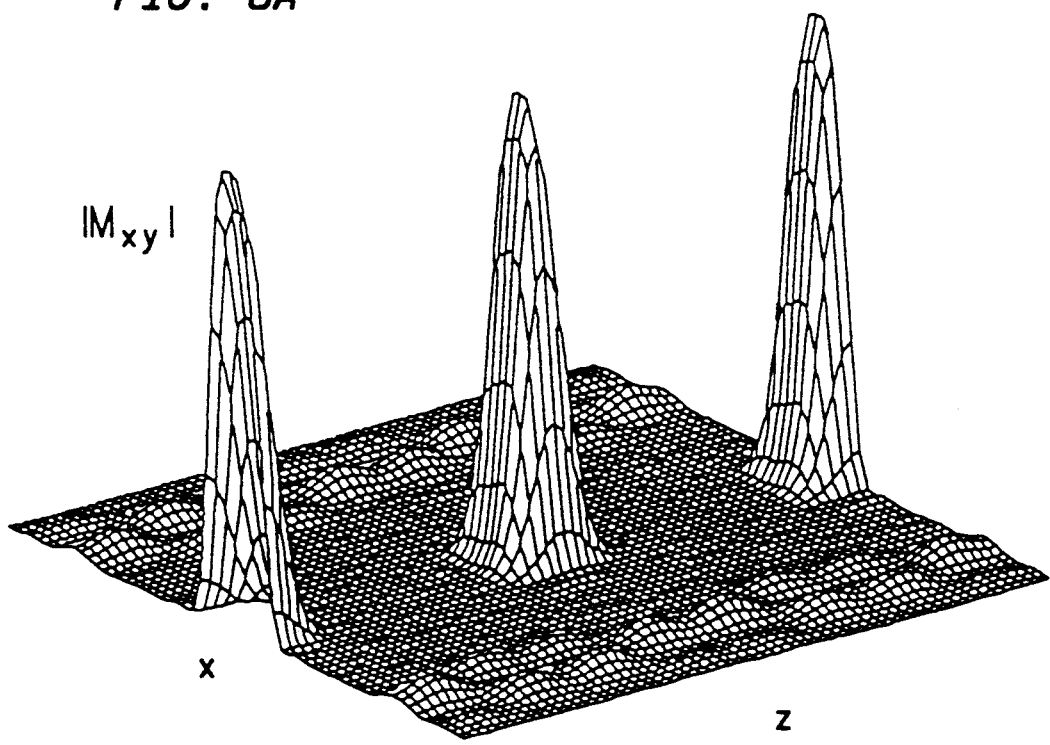

The RF and gradient waveforms for the 3-D pulse are plotted in FIG. 5. It can be used as either a spin-echo pulse or an inversion pulse. A simulation of the spin-echo profile is plotted in FIG. 6. The plots are of $|M_{xy}|$. $M_x$ is less than 4% indicating the selected volume is very well refocused. FIG. 4 shows the x-y and x-z profiles. The inversion profiles are essentially identical, except that the plots would be labeled $-M_z$, and the axis would go from $-1$ to 1.

Figure 7A:
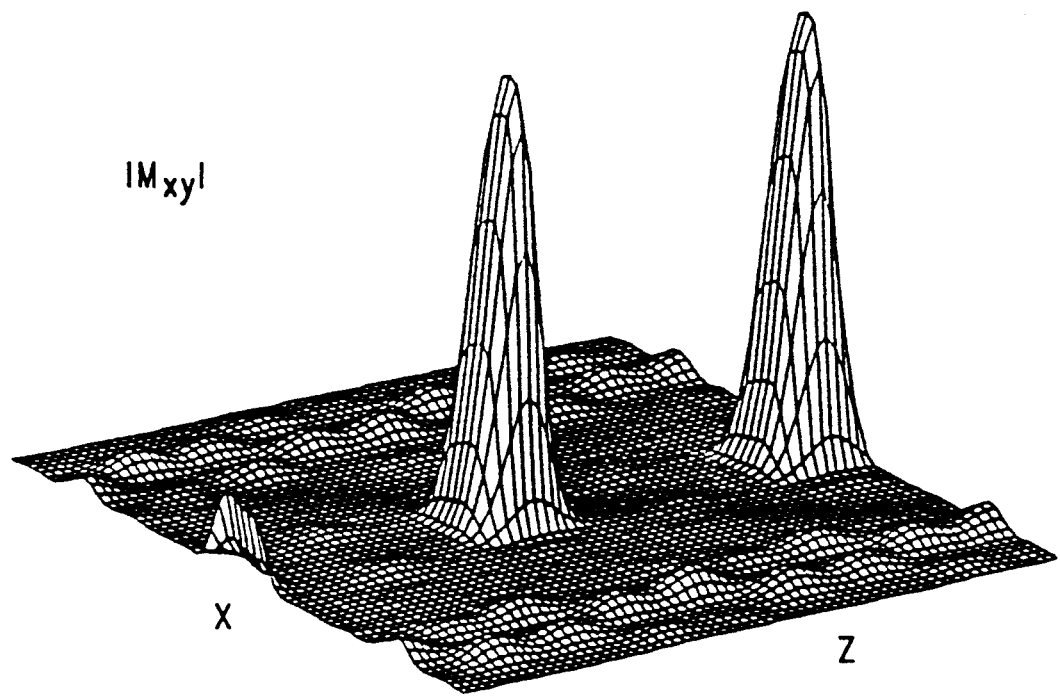
FIGS. 7A, 7B are simulated spin echo profiles illustrating the effect of off resonance frequency on the selected volume profile.
Figure 7B:
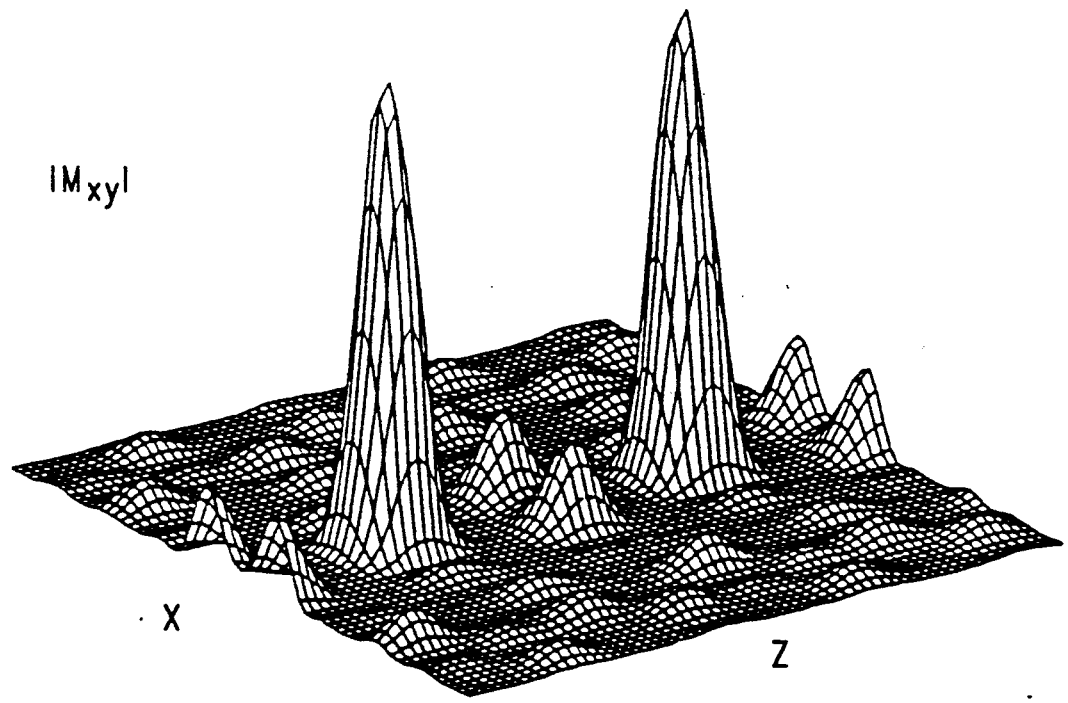

Off-resonance effects are a major concern with this pulse. Small off-resonance frequencies simply shift the selected volume in the z direction. FIG. 7A shows the effect of a one-cycle shift over the duration of the pulse. At 1.5 T this corresponds to 1 ppm for a 16 ms pulse. Aside from the shift in z the profile is relatively unaffected. Larger off-resonance shifts cause larger shifts in the z direction, along with appearance of "N/2" sidelobes. These have the same origin as the antisymmetric ghost sidelobes familiar from spectral-spatial pulses. FIG. 7B shows the effect of a four-cycle shift, which corresponds to 4 ppm at 1.5 T. The shift in z is four times that of FIG. 7B, and substantial N/2 sidelobes have been produced.

Figure 8A:
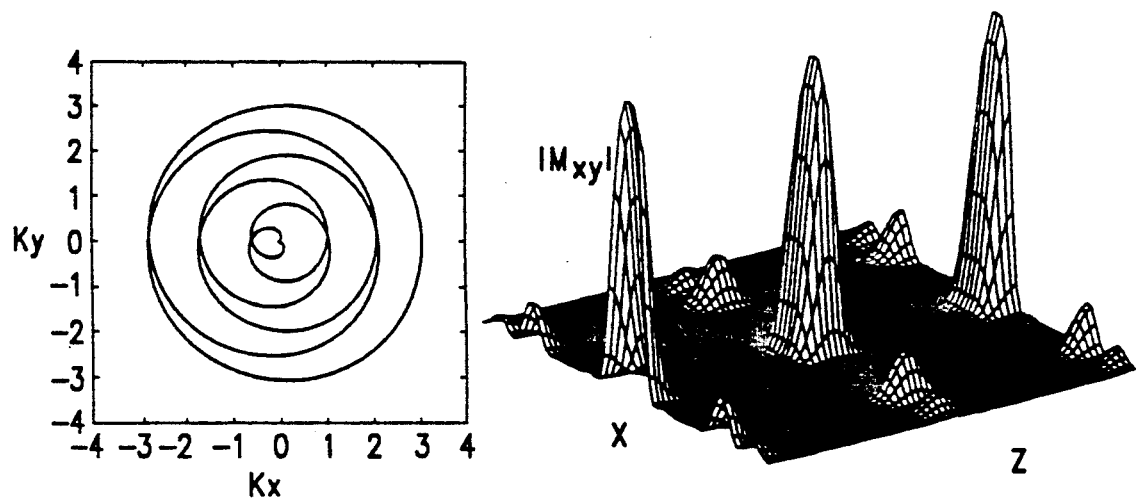
FIGS. 8A, 8B illustrate peak side lobe reduction by rotating the inward-outward spiral pairs.
Figure 8B:
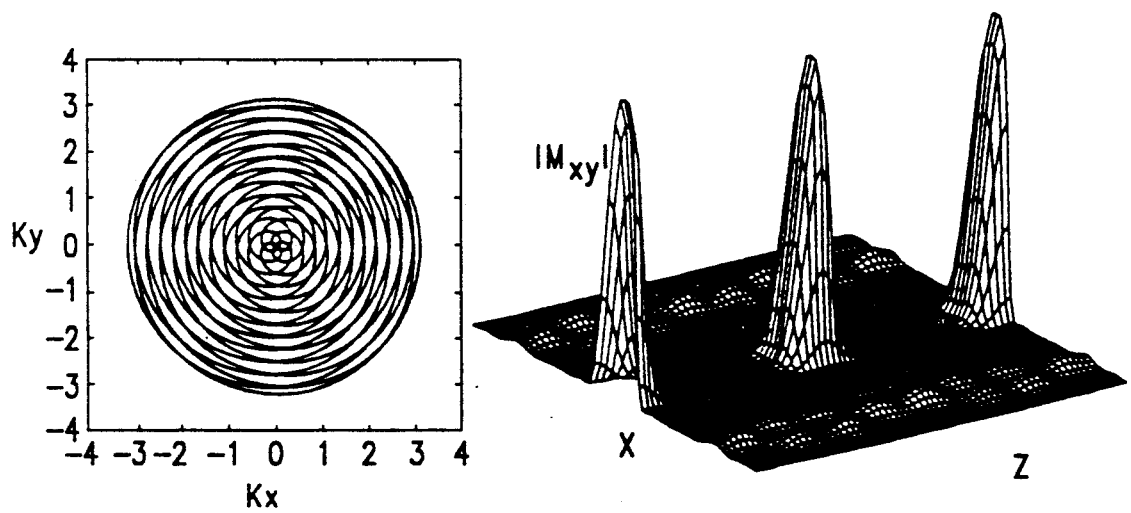

Another major concern for this pulse is the amplitude and location of the x-y sidelobe. These are far less than expected, at most 5%. The sidelobes of spiral $\pi/2$ pulses are on the order of 20 to 30 percent of the peak. There are two reasons why this pulse has such low sidelobes. First, the sidelobes reflect a flip angle on the order of 25° degrees. This is a very effective flip angle for an excitation pulse, but a very poor flip angle for a spin-echo or inversion pulse. The second factor is the rotation of the spiral gradients by 90° from one outward-inward spiral pair to the next. This is illustrated in FIG. 8. FIG. 8A is the $k_x$-$k_y$ trajectory for the pulse where the same spiral gradient has been used for each inward-outward pair. FIG. 8B is the corresponding x-z profile. The large sidelobes at z=0 have an amplitude of 15%. FIG. 8C is the $k_x$-$k_y$ trajectory for the pulse where each inward-outward spiral pair has been rotated 90° from the previous spiral pair. This gives a much more uniform $k_x$-$k_y$ coverage. The x-z profile is plotted in FIG. 8D. The sidelobe has been reduced in amplitude to 5%, and spread out fairly uniformly in z.

Figure 9:
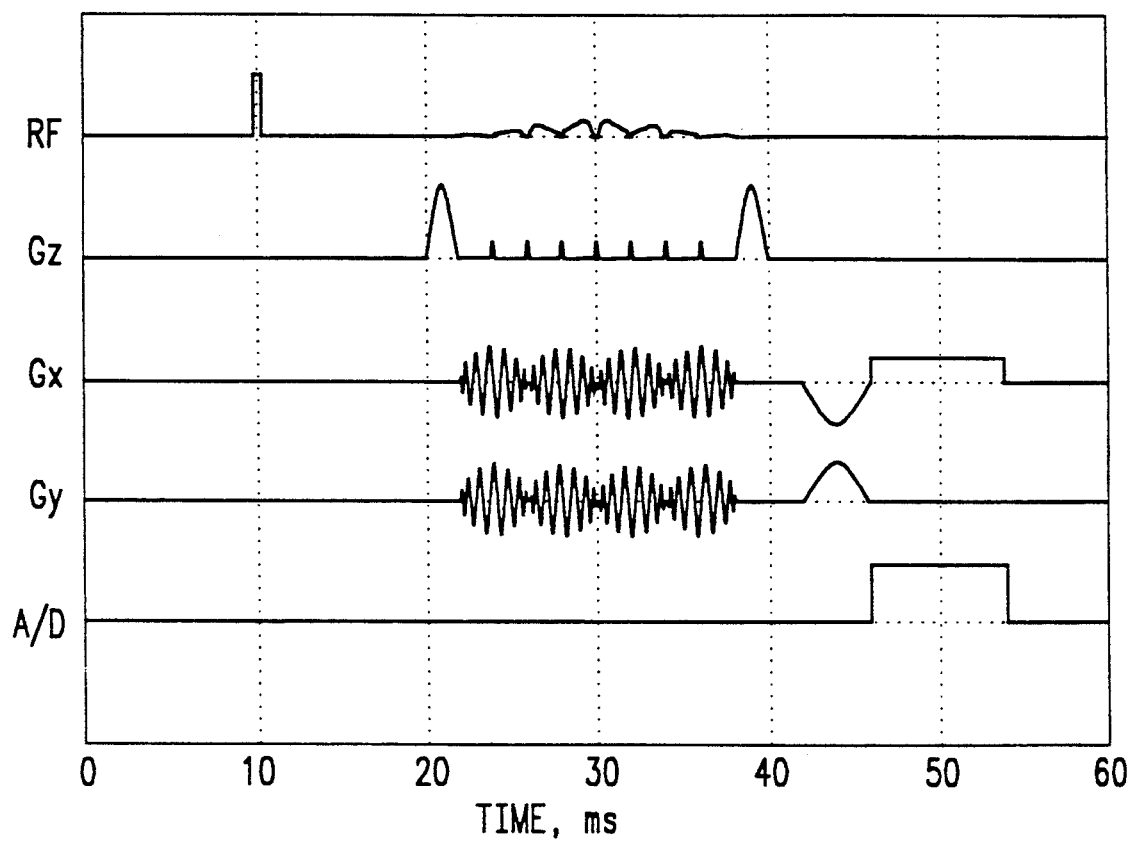
FIG. 9 illustrates a pulse sequence using the three dimensional excitation pulse in accordance with the invention as a spin echo pulse.
Figure 10A:
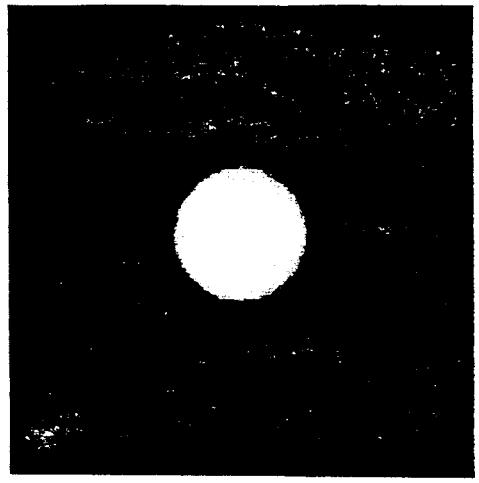
FIGS. 10A-10D are projection images of a volume refocused using the selective three-dimensional excitation pulse in accordance with the invention.
Figure 10B:
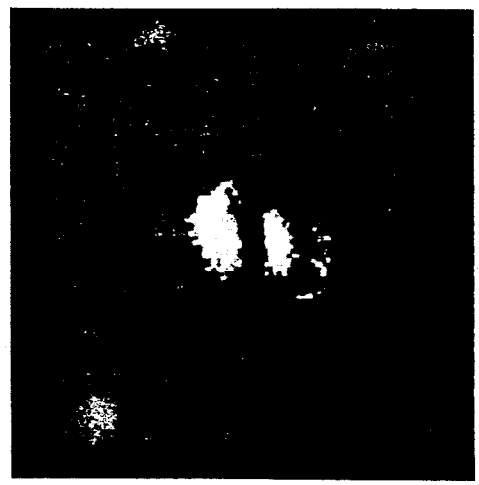
Figure 10C:
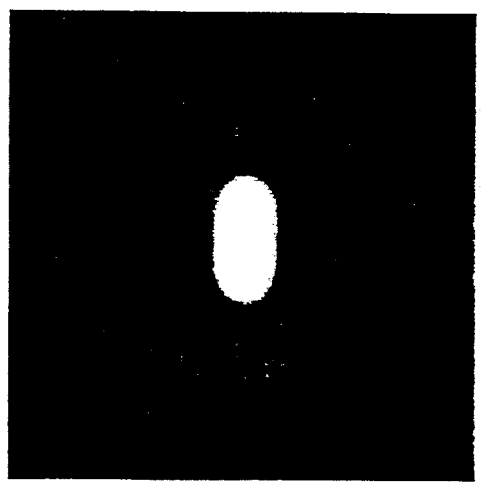
Figure 10D:

Experimental spin-echo profiles have been obtained using apparatus in accordance with the invention. A pulse sequence using the three-dimensional pulse to created a spin-echo is plotted in FIG. 9. An initial hard $\pi/2$ pulse creates transverse magnetization. The three-dimensional pulse refocuses an ellipsoid, which is then imaged in projection.

The imaging machine was a 1.5 T Signa system from GE Medical Systems Group, Milwaukee, Wis. It was equipped with shielded gradient coils and stock gradient amplifiers. A 20 cm sphere filled with doped water was used as a phantom The duration of the spin-echo pulse was 16 ms, and the maximum x and y gradient amplitudes were 0.25 G/cm. This results in gradient slew-rates of 1.7 (G/cm)/ms, which is the rated limit on the system. Projection images in the x - z and x - y planes are shown in FIGS. 10A–10D. The field-of-view is 24 cm, and the repetition time is 400 ms. The images of the $M_x$ component are multiplied by 10. The half-amplitude volume is 4 cm in x and y by 2 cm in z. This pulse performs very well as a spin-echo pulse.

There has been described a selective three-dimensional pulse which is useful in spin echo and inversion applications on existing commercial imaging machines. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A method of selectively exciting nuclear spins in a selected three-dimensional volume comprising applying a plurality of RF subpulses to said volume in the presence of three orthogonal magnetic gradients (Gx, Gy, Gz) over a period of time to define a k-space trajectory including a plurality of stacked two-dimensional k-space spirals the steps from one spiral to the next spiral corresponding to gradient pulses ($G_z$).

2. The method as defined by claim 1 wherein said plurality of stacked two-dimensional k-space spirals are arranged in pairs with each pair having an outward spiral and an inward spiral.

3. The method as defined by claim 1 wherein the steps from one spiral to the next spiral corresponding to gradient pulses ($G_z$) alternate at the edge and at the origin of each k-space spiral plane.

4. The method as defined by claim 1 wherein each RF subpulse is generated by the steps of
   defining a small tip angle excitation pulse which produces a rotation of nuclear spins about an axis,
   producing a sequence of small tip angle excitation pulses, and
   concatenating said sequence of small tip angle excitation pulses whereby the sum of the tip angles produced by said sequence of pulses produces a desired net large tip angle.

5. The method as defined by claim 2 wherein each pair of k-space spirals is rotated from a previous pair to reduce side lobe excitation peaks.

6. The method as defined by claim 1 and further including the steps of applying a non-selective 90° pulse to said volume prior to applying said plurality of RF subpulses, allowing nuclear spins in said volume to precess, and applying said plurality of RF subpulses to selectively refocus nuclear spins in said volume, and detecting an echo signal.

7. The method as defined by claim 1 wherein said step of applying a plurality of RF pulses tags nuclear spins of moving fluid in said volume, and further including the step of detecting signals of said tagged nuclear spins.

8. The method as defined by claim 7 wherein said moving fluid is blood and said echo signal provides selective inversion recovery angiography.

9. Apparatus for selectively exciting nuclear spins in a selected three-dimensional volume comprising means for applying three orthogonal magnetic gradients (Gx, Gy, Gz) over a period of time, and means for applying a plurality of RF subpulses in the presence of three orthogonol magnetic gradients to define a k-space trajectory including a plurality of stacked two-dimensional k-space spirals, the steps from one spiral to the next spiral corresponding to gradient pulses ($G_z$).

10. Apparatus as defined by claim 9 wherein said plurality of stacked two-dimensional k-space spirals are arranged in pairs with each pair having an outward spiral and an inward spiral.

11. Apparatus as defined by claim 10 wherein each pair of k-space spirals is rotated from a previous pair to reduce side lobe excitation peaks.

12. Apparatus as defined by claim 9 and further including means for applying a non-selective 90° pulse to said volume prior to applying said plurality of RF subpulses and allowing nuclear spins in said volume to precess, said plurality of RF subpulses selectively refocusing nuclear spins in said volume, and means for detecting an echo signal.

13. Apparatus as defined by claim 9 wherein said means for applying a plurality of RF pulses tags nuclear spins and moving fluid in said volume, and further including means for detecting an echo of said tagged nuclear spins.

* * * * *